US012751174B2

(12) United States Patent
Jin et al.

(10) Patent No.: US 12,751,174 B2
(45) Date of Patent: Sep. 29, 2026

(54) DISPLAY PANEL AND DISPLAY APPARATUS

(71) Applicant: BOE TECHNOLOGY GROUP CO., LTD., Beijing (CN)

(72) Inventors: Qian Jin, Beijing (CN); Yang Li, Beijing (CN); Wei Huang, Beijing (CN); Liangliang Kang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 402 days.

(21) Appl. No.: 18/270,885

(22) PCT Filed: Aug. 25, 2022

(86) PCT No.: PCT/CN2022/114799
§ 371 (c)(1),
(2) Date: Jul. 5, 2023

(87) PCT Pub. No.: WO2024/040511
PCT Pub. Date: Feb. 29, 2024

(65) Prior Publication Data
US 2024/0381731 A1 Nov. 14, 2024

(51) Int. Cl.
*H10K 59/38* (2023.01)
*H10K 59/122* (2023.01)

(52) U.S. Cl.
CPC .......... *H10K 59/38* (2023.02); *H10K 59/122* (2023.02)

(58) Field of Classification Search
CPC .......................... H10K 59/38; H10K 59/122
USPC ........................................ 313/500
See application file for complete search history.

(56) References Cited

U.S. PATENT DOCUMENTS

| | | | | |
|---|---|---|---|---|
| 10,962,705 B2 * | 3/2021 | Shin | F21K 9/64 |
| 2016/0193478 A1 * | 7/2016 | Maxik | H05B 45/00 362/231 |
| 2018/0011364 A1 * | 1/2018 | Deng | H05B 33/28 |
| 2018/0202616 A1 | 7/2018 | Yoon et al. | |

(Continued)

FOREIGN PATENT DOCUMENTS

| | | |
|---|---|---|
| CN | 110646980 A | 1/2020 |
| CN | 211088315 U | 7/2020 |

(Continued)

OTHER PUBLICATIONS

Espacenet Patent Search Complete (Global Dossier) (Year: 2022).*

*Primary Examiner* — James R Greece
*Assistant Examiner* — Hana S Featherly
(74) *Attorney, Agent, or Firm* — WHDA, LLP

(57) ABSTRACT

Disclosed are a display panel and a display apparatus. The display panel includes: a light-emitting base substrate comprising a plurality of light-emitting elements and configured to emit a first light; a color conversion substrate comprising a plurality of color conversion patterns, the color conversion pattern comprising a matrix material and quantum dots dispersed in the matrix material, wherein the matrix material is configured to excite a second light under irradiation of the first light, and the quantum dots are configured to emit light under irradiation of the first light and the second light. By exciting the quantum dots with the light emitted by the light-emitting elements and the light emitted by the matrix material, the luminous efficiency of the quantum dots can be improved and the power consumption can be reduced.

20 Claims, 3 Drawing Sheets

(56) References Cited

U.S. PATENT DOCUMENTS

| | | | | |
|---|---|---|---|---|
| 2018/0219183 | A1* | 8/2018 | Song | H10K 59/8731 |
| 2019/0049786 | A1* | 2/2019 | Lazo Martinez | G02B 5/3058 |
| 2019/0270116 | A1* | 9/2019 | Chang | H04N 9/3158 |
| 2019/0363146 | A1* | 11/2019 | Takahashi | H10K 59/873 |
| 2020/0212122 | A1* | 7/2020 | Asaoka | G02B 5/223 |
| 2021/0257575 | A1* | 8/2021 | Yoon | H10K 50/121 |
| 2021/0273022 | A1 | 9/2021 | Park et al. | |
| 2021/0399260 | A1 | 12/2021 | Kim et al. | |

FOREIGN PATENT DOCUMENTS

| | | | |
|---|---|---|---|
| CN | 113327959 | A | 8/2021 |
| CN | 113809262 | A | 12/2021 |
| CN | 114106814 | A | 3/2022 |
| JP | 2019113765 | A | 7/2019 |
| KR | 20200117293 | A | 10/2020 |

* cited by examiner

DISPLAY PANEL AND DISPLAY APPARATUS

CROSS-REFERENCE TO RELATED APPLICATIONS

The present application is the U.S. national phase of PCT Application No. PCT/CN2022/114799 filed on Aug. 25, 2022, the disclosure of which is hereby incorporated by reference in its entirety.

TECHNICAL FIELD

The present disclosure relates to the field of displaying technology, and in particular, to a display panel and a display apparatus.

BACKGROUND

As continuous growing of the living standard, the requirement for displaying quality of displays also improves, especially in terms of color gamut and brightness. As a new type of material, the quantum dot is used in the photoluminescence structure, and has advantages of concentrated light spectrum, high purity, tunable emission wavelength, narrow spectral linewidth, high luminous efficiency, and good optical, thermal and chemical stability. The quantum dot is formed by solution processing, spin coating or ink-jet printing, and emit light under optical excitation, and is applied as a new generation of luminescent material in the solid state lighting and the full color display panel. Recently, more attention is paid to the technology of combining blue light backlight and the quantum dots due to its advantages such as high color gamut. However, the conventional device has disadvantages such as low light conversion efficiency of the quantum dot, low overall brightness and high power consumption.

SUMMARY

Embodiments of the present disclosure provide a display panel and a display apparatus.

In a first aspect, an embodiment of the present disclosure provides a display panel, including:

- a light-emitting base substrate, the light-emitting base substrate including a plurality of light-emitting elements and configured to emit a first light; and
- a color conversion substrate, the color conversion substrate including a plurality of color conversion patterns, the color conversion pattern including a matrix material and quantum dots dispersed in the matrix material,
- where the matrix material is configured to excite a second light under irradiation of the first light, and the quantum dots are configured to emit light under irradiation of the first light and the second light.

Optionally, the color conversion patterns include a first color conversion pattern and a second color conversion pattern;

- the first color conversion pattern includes a first matrix material and first quantum dots dispersed in the first matrix material, the first matrix material is configured to excite the second light under irradiation of the first light, and the first quantum dots are configured to emit a light of a first wavelength under irradiation of the first light and the second light;
- the second color conversion pattern includes a second matrix material and second quantum dots dispersed in the second matrix material, the second matrix material is configured to excite the second light under irradiation of the first light, and the second quantum dots are configured to emit a light of a second wavelength under irradiation of the first light and the second light, where the first wavelength is different from the second wavelength.

Optionally, the color conversion patterns include a third color conversion pattern, the third color conversion pattern including a third matrix material, and the third matrix material is configured to excite a light of a third wavelength under irradiation of the first light, the first wavelength and the second wavelength being different from the third wavelength.

Optionally, the first light has a first light wavelength, and the first light wavelength is less than or equal to 450 nm.

Optionally, the second light has a second light wavelength, and the second light wavelength is greater than 450 nm and less than or equal to 460 nm.

Optionally, a difference between a peak wavelength of the first light and a peak wavelength of the second light is greater than or equal to 10 nm.

Optionally, the color conversion substrate further includes scattering particles dispersed in the matrix material.

Optionally, the display substrate further includes a scattering particle layer disposed between the color conversion substrate and the light-emitting elements.

Optionally, the matrix material includes:

- at least one of pyridine polymer, carbazole polymer, fluorene oligomer, polythiophene polymer, or polyphenylene vinylene polymer.

Optionally, the display substrate further includes

- a first barrier layer, the first barrier layer having a plurality of first grooves, the plurality of color conversion patterns being disposed in the plurality of first grooves.

Optionally, the display substrate further includes:

- a second barrier layer, having a plurality of second grooves;
- a scattering particle layer disposed in the second grooves, where an area of the scattering particle layer is smaller than an area of the color conversion pattern; and
- a pixel defining layer, including a plurality of openings, where each of the plurality of light-emitting elements is disposed in one of the plurality of openings, and an area of the opening is larger than the area of the scattering particle layer.

Optionally, the display substrate further includes a color filter, located at a side of the color conversion pattern away from the light-emitting base substrate.

In a second aspect, an embodiment of the present disclosure provides a display apparatus, including the display panel as described in the above embodiments, a driving circuit, and a power supply circuit.

REFERENCE SIGNS

Figure 1:
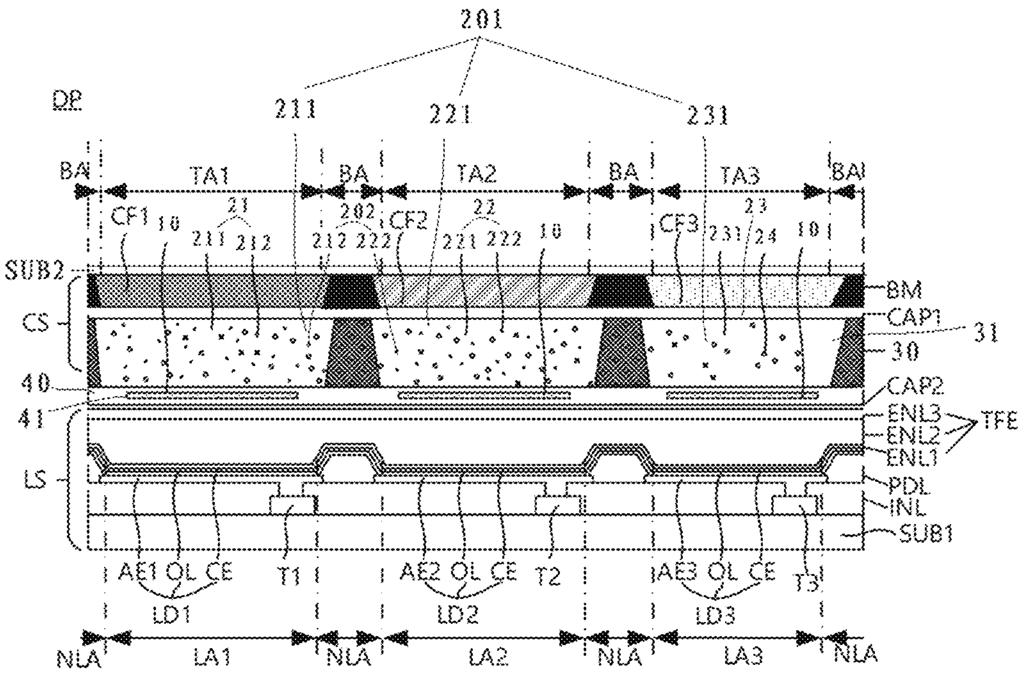
FIG. 1 is a schematic diagram of a display panel in an embodiment of the present disclosure.

Scattering particle layer 10;
Matrix material 201; Quantum dot 202;
Second color conversion pattern 21;
First matrix material 211; First quantum dot 212;
Second color conversion pattern 22;
Second matrix material 221; Second quantum dot 222;
Third color conversion pattern 23; Third matrix material 231;
Scattering particle 24;
First barrier layer 30; First groove 31;
Second barrier layer 40; Second groove 41.

DETAILED DESCRIPTION

Embodiments of the present disclosure will be described in details hereinafter with reference to the accompanying drawings. Apparently, the described embodiments are some, rather than all of embodiments of the disclosure. Based on the embodiments of the present disclosure, all other embodiments obtained by a person skilled in the art in the art without inventive effort fall within the scope of the present disclosure.

The terms "first", "second", and the like in the description and in the claim are used for distinguishing between similar items and not necessarily for describing a particular sequential or chronological order. It is to be understood that the terms so used are interchangeable under appropriate circumstances such that the embodiments of the disclosure can be implemented in other sequences than those illustrated or described herein. In addition, in the description and the claims, "and/or" means at least one of the connected objects, and the character "/" generally means that the associated object is subjected to an "or" relationship.

The display panel in the embodiments of the present disclosure may be applied to various electronic devices, for example, small and medium-sized electronic devices such as a tablet computer, a smart phone, a head mounted display, a car navigation unit, a camera, a central information display (CID) provided in a vehicle, a watch-type electronic device or other wearable devices, a personal digital assistant (PDA), a portable multimedia player (PMP), and a game machine, and large and medium-sized electronic devices such as a television, an external billboard, a monitor, a home appliance including a display screen, a personal computer, and a laptop computer. The electronic devices as described above may represent mere examples for applying such display apparatus, a person skilled in the art may recognize that the display panel may also be applied to other electronic devices without departing from the spirit and scope of the present disclosure.

Hereinafter, a display panel according to embodiments of the present disclosure will be described in detail with reference to specific implementations and application scenarios thereof in conjunction with illustrations of FIGS. 1 to 7.

Figure 3:
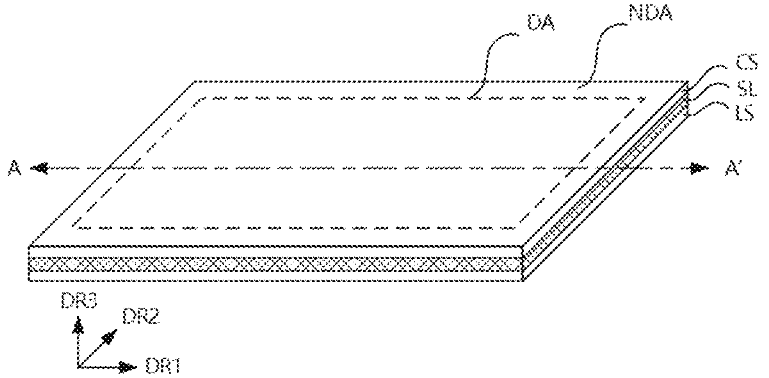
FIG. 3 is a schematic diagram showing a light-emitting base substrate mated with a color conversion substrate.
Figure 4:
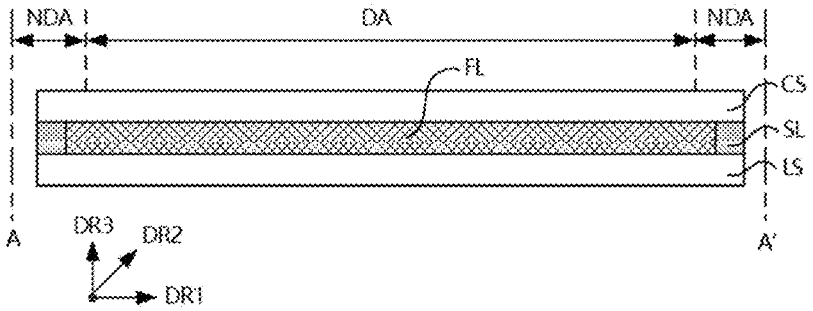
FIG. 4 is a cross-sectional view taken along line A-A' of FIG. 3.

As shown in FIGS. 1, 3 and 4, in an embodiment of the present disclosure, a display panel DP includes: a light-emitting base substrate LS and a color conversion substrate CS, the light-emitting base substrate LS includes a plurality of light-emitting elements LD, the light-emitting elements LD are configured to emit a first light, the color conversion substrate CS includes a plurality of color conversion patterns, each color conversion pattern includes a matrix material 201 and quantum dots 202 dispersed in the matrix material 201, where the matrix material 201 is configured to excite a second light under the irradiation of the first light, and the quantum dot 202 is configured to emit light under the irradiation of the first light and the second light, the light emitted by the quantum dot when being excited by the first light and the light emitted by the quantum dot when being excited by the second light may have the same wavelength. The first light may be blue light or ultraviolet light and the second light may be blue light. For example, the light-emitting element LD may emit blue light, the blue light emitted by the light-emitting element LD may excite the quantum dot to emit red light or green light. The blue light emitted by the light-emitting element LD may excite the matrix material 201 to emit blue light, the blue light emitted by the matrix material 201 may excite the quantum dot 202 to emit red light or green light. The light emitted by the color conversion pattern may pass through a color filter according to practical requirements, so that a light of a desired wavelength can be emitted.

As shown in FIG. 1, the light-emitting base substrate LS may include a first base substrate SUB1. The first base substrate SUB1 may be made of a light-transmitting material, such as inorganic glass, organic glass, plastic substrate or other organic material substrate. The first base substrate SUB1 may be rigid or flexible. A buffer layer or an insulating layer may also be provided on the first base substrate SUB1 to provide a substrate surface with better performance.

The light-emitting base substrate LS may include a plurality of switch elements on the first base substrate SUB1. In one light-emitting area repeating unit, the switch elements include a first switch element T1, a second switch element T2, and a third switch element T3. For example, the first switch element T1 may be located in a first light-emitting area LA1, the second switch element T2 may be located in a second light-emitting area LA2, and the third switch element T3 may be located in a third light-emitting area LA3. As another example, at least one of the first switch element T1, the second switch element T2, and the third switch element T3 may be located in a non-light-emitting area NLA. At least one of the first switch element T1, the second switch element T2, and the third switch element T3 may be a thin-film transistor including polysilicon or a thin-film transistor including an oxide semiconductor. For example, when the switch element is the thin-film transistor including the oxide semiconductor, the switch element may have a thin-film transistor structure having a top gate. The switch element may be connected to a signal line including, but not limited to, a gate line, a data line, and a power line.

The light-emitting base substrate LS may include an insulating layer INL, which may be located on the first switch element T1, the second switch element T2 and the third switch element T3. The insulating layer INL may have a planarized surface. The insulating layer INL may be made of an organic layer. For example, the insulating layer INL may include acrylic resin, epoxy resin, imide resin, ester resin, or the like. The insulating layer INL may have a through hole exposing electrodes of the first switch element T1, the second switch element T2 and the third switch element T3 for realizing electrical connections.

The light-emitting base substrate LS may include a plurality of light-emitting elements LD located on the first base substrate SUB1. In one light-emitting area repeating unit, the light-emitting element LD includes a first light-emitting element LD1, a second light-emitting element LD2, and a third light-emitting element LD3. For example, the first light-emitting element LD1 may be located in the first light-emitting area LA1, the second light-emitting element LD2 may be located in the second light-emitting area LA2, and the third light-emitting element LD3 may be located in the third light-emitting area LA3.

The first light-emitting element LD1 includes a first anode AE1, the second light-emitting element LD2 includes a second anode AE2, and the third light-emitting element LD3 includes a third anode AE3. The first anode AE1, the second anode AE2, and the third anode AE3 may be disposed on the insulating layer INL. The first anode AE1 may be located in the first light-emitting area LA1 and may be connected to the first switch element T1 via a through hole in the insulating layer INL. The second anode AE2 may be located in the second light-emitting area LA2 and may be connected to the second switch element T2 via a through hole in the insulating layer INL. The third anode AE3 may be located in the third light-emitting area LA3 and may be connected to the third switch element T3 via a through hole in the insulating layer INL. At least a portion of at least one of the first anode AE1, the second anode AE2 and the third anode AE3 may extend into the non-light-emitting area NLA. The width or area of the first anode AE1, the second anode AE2, and the third anode AE3 may be the same or may be different from each other. In some embodiments, the width of the first anode AE1 may be greater than the width of the second anode electrode AE2, and the width of the second anode electrode AE2 may be greater than the width of the third anode electrode AE3. In other embodiments, the first anode AE1, the second anode AE2, and the third anode AE3 may be reflective electrodes. The first anode AE1, the second anode AE2 and the third anode AE3 may have a single-layer or a stacked-layers structure, and may be made of a metal such as Ag, Mg, Al, Pt, Pd, Au, Ni, Nd, Ir or Cr, a mixture thereof, or a conductive metal oxide material such as ITO, IZO or IGZO.

The light-emitting base substrate LS may include a pixel defining layer PDL on the first anode AE1, the second anode AE2 and the third anode AE3. The pixel defining layer PDL may include apertures for exposing the first anode AE1, the second anode AE2, and the third anode AE3, and may define the first light-emitting area LA1, the second light-emitting area LA2, the third light-emitting area LA3, and the non-light-emitting area NLA. The material of the pixel defining layer PDL may be at least one of an organic insulating material such as acrylic resin, epoxy resin, phenolic resin, polyamide resin, polyimide resin, unsaturated polyester resin, polyphenylene resin, polyphenylene sulfide resin, and benzocyclobutene (BCB).

Figure 2:
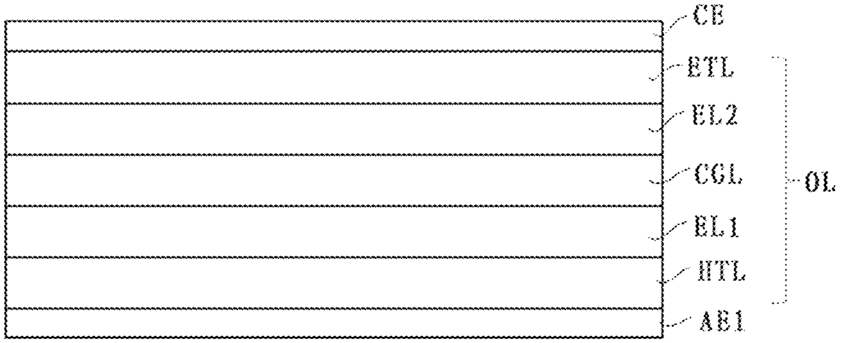
FIG. 2 is a schematic diagram showing an arrangement of a light-emitting layer in an embodiment of the present disclosure.

The first light-emitting element LD1, the second light-emitting element LD2 and the third light-emitting element LD3 further include a common light-emitting layer OL. The light-emitting layer OL may have a shape of a continuous film formed over the light-emitting areas LA1, LA2, LA3, LA4, LA5, and LA6 and the non-light-emitting area NLA. The light-emitting layer OL may include a plurality of layers stacked over one another. In some embodiments, as shown in FIG. 2, the light-emitting layer OL may include a first hole transport layer HTL located on the first anode AE1, a first light-emitting material layer EL1 located on the first hole transport layer HTL, and a first electron transport layer ETL located on the first light-emitting material layer EL1. The first light-emitting material layer EL1 may be a blue light-emitting layer. In some other embodiments, in addition to the first hole transport layer HTL, the first light-emitting material layer EL1 and the first electron transport layer ETL, the light-emitting layer OL may include a first charge generation layer CGL located on the first light-emitting material layer EL1 and a second light-emitting material layer EL2 on the first charge generation layer CGL. The first electron transport layer ETL may be located on the second light-emitting material layer EL2. The second light-emitting material layer EL2 may emit blue light, which is similar to the first light-emitting material layer EL1. The second light-emitting material layer EL2 may emit a blue light having the same or different peak wavelength as that emitted by the first light-emitting material layer EL1. The first light-emitting material layer EL1 and the second light-emitting material layer EL2 may emit light of different colors. For example, the first light-emitting material layer EL1 may emit blue light and the second light-emitting material layer EL2 may emit green light. The structure including two or more light-emitting material layers can improve the luminous efficiency and lifetime of the light-emitting element LD. A person skilled in the art would have been able to set the quantity of light-emitting material layers according to actual needs, and the present disclosure is not limited thereto.

The first light-emitting element LD1, the second light-emitting element LD2 and the third light-emitting element LD3 further include a common cathode CE. The cathode CE may be located on the light-emitting layer OL. The cathode CE may be semi-transparent or transparent. In some embodiments, the cathode CE may include Ag, Mg, Cu, Al, Pt, Pd, Au, Ni, Nd, Ir, Cr, Li, Ca, LiF/Ca, LiF/Al, Mo, Ti, or compounds or mixtures thereof, such as a mixture of Ag and Mg. In other embodiments, the cathode CE may include a transparent conductive oxide (TCO). For example, the cathode CE may include tungsten oxide ($W_xO_x$), titanium oxide ($TiO_2$), indium tin oxide (ITO), indium zinc oxide (IZO), zinc oxide (ZnO), indium tin zinc oxide (ITZO) or magnesium oxide (MgO), etc. In some embodiments, the light-emitting base substrate LS may further include an auxiliary cathode. The auxiliary cathode can reduce the resistance of the cathode layer, thereby improving the IR drop of the cathode and improving the uniformity of the large-sized OLED light-emitting base substrate.

The light-emitting base substrate LS further includes a thin film encapsulation layer TFE arranged on the cathode CE. The thin film encapsulation layer TFE may have a shape of a continuous film formed over the light-emitting areas LA1, LA2, LA3, LA4, LA5 and LA6 and the non-light-emitting area NLA. The thin film encapsulation layer TFE may include a first encapsulation layer ENL1, a second encapsulation layer ENL2 and a third encapsulation layer ENL3 arranged in a stack. For example, the first encapsulation layer ENL1 and the third encapsulation layer ENL3 are made of an inorganic material selected from at least one of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON) or lithium fluoride. As another example, the second encapsulation layer ENL2 is made of an organic material which is at least one of acrylic resin, methacrylic resin, polyisoprene, vinyl resin, epoxy resin, polyurethane resin, cellulose resin or perylene resin. The quantity of layers, the type of materials, and the structure of the thin film encapsulation layer TFE can be changed by those skilled in the art according to actual needs, and the present disclosure is not limited thereto.

In the display panel of the embodiment of the present disclosure, the light-emitting element LD is configured to emit the first light, the color conversion substrate CS includes the plurality of color conversion patterns, the color conversion pattern includes the matrix material 201 and the quantum dots 202 dispersed in the matrix material 201, the matrix material 201 is configured to excite the second light under irradiation of the first light, and the quantum dots 202 are configured to emit light under irradiation of the first light and the second light. The first light emitted by the light-emitting elements LD can excite the quantum dots and the matrix material to emit light, and the second light emitted by the matrix material 201 under the irradiation of the first light can excite the quantum dots to emit light, so that the quantum dots can excite light with the light emitted by the light-emitting element LD and the light emitted by the matrix material 201, thereby improving the luminous efficiency of the quantum dots. The conversion efficiency of the solution in which both the matrix material 201 and the quantum dots 202 are used can increase by more than 25% compared with the luminous efficiency of a pure quantum dot thin film, which can improve the display brightness of the display panel and reduce power consumption. In addition, there is no need for adding scattering particles, and agglomeration of particles of multiple components can be reduced, and the clogging of the spray head can be effectively avoided when the film is prepared by printing.

In some embodiments, as shown in FIG. 1, the color conversion patterns include a first color conversion pattern 21 and a second color conversion pattern 22, the first color conversion pattern 21 includes a first matrix material 211 and first quantum dots 212 dispersed in the first matrix material 211, the first matrix material 211 is configured to excite the second light under the irradiation of the first light, and the first quantum dot 212 is configured to emit a light of a first wavelength under the irradiation of the first light and the second light. For example, the first quantum dot 212 may be a red light quantum dot, the first light emitted by the light-emitting element may excite the first quantum dot 212 to emit red light, and the second light emitted by the first matrix material 211 under the irradiation of the first light may excite the first quantum dots 212 to emit red light.

The second color conversion pattern 22 includes a second matrix material 221 and second quantum dots 222 dispersed in the second matrix material 221, the first matrix material 211 and the second matrix material 221 may be the same or different. The second matrix material 221 is configured to excite the second light under the irradiation of the first light, and the second quantum dots 222 are configured to emit a light of a second wavelength under the irradiation of the first light and the second light, the first wavelength being different from the second wavelength. For example, the second quantum dot 222 may be a green light quantum dot, the first light emitted by the light-emitting element may excite the second quantum dot 222 to emit green light, and the second light emitted by the second matrix material 221 under the irradiation of the first light may excite the second quantum dot 222 to emit green light. By combining different matrix materials with quantum dots, different lights can be emitted from the color conversion pattern under the irradiation of the first light, so as to improve the luminous efficiency of the quantum dots, and a suitable matrix material can be selected to cooperate with the quantum dots according to practical requirements, so as to enable the color conversion pattern to emit light as required under the irradiation of the first light.

In some other embodiments, as shown in FIG. 1, the color conversion patterns include a third color conversion pattern 23, the third color conversion pattern 23 includes a third matrix material 231. The third matrix material 231, the first matrix material 211 and the second matrix material 221 may be the same or different, and the third matrix material 231 is configured to excite a light of a third wavelength under the irradiation of the first light, the first wavelength and the second wavelength being different from the third wavelength. For example, the third matrix material 231 may emit blue light under the irradiation of the first light. The first color conversion pattern 21, the second color conversion pattern 22 and the third color conversion pattern 23 may form a pixel unit, the light of the first wavelength may be red light, the light of the second wavelength may be green light, the light of the third wavelength may be blue light, and the light of the first wavelength, the second wavelength and the third wavelength may be mixed into white light so as to realize displaying. The quantum dot is excited by the light emitted by the light-emitting element and by the light emitted by the matrix material, and the excitation light emitted by the quantum dot can be mixed with the excitation light emitted by the matrix material to generate the required light. In this way, the luminous efficiency of the quantum dots can be improved and the power consumption can be reduced.

Optionally, the first light has a first light wavelength which is less than or equal to 450 nm, e.g., the first light wavelength may be 395 nm. Optionally, the second light has a second light wavelength which is greater than 450 nm and less than or equal to 460 nm, and the second light wavelength may be 455 nm. The difference between a peak wavelength of the first light and a peak wavelength of the second light is greater than or equal to 10 nm, and both the first light wavelength and the second light wavelength may be peak wavelengths. For example, the difference between the first light wavelength and the second light wavelength is greater than or equal to 10 nm, 20 nm, 30 nm, 40 nm, or 50 nm.

Figure 6:
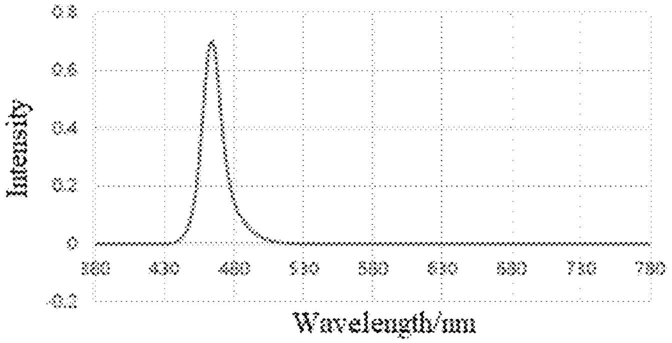
FIG. 6 is a spectrum of a matrix material.

As shown in FIG. 6, the luminescence spectrum of the matrix material may be shown by the curve in FIG. 6, the luminescence wavelength of the light-emitting element is 395 nm, and the matrix material may be represented by Formula (1):

Formula (1)

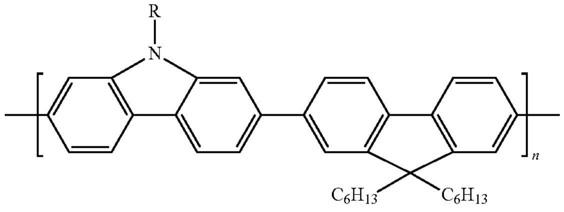

where R in Formula (1) may include one or more of hydrogen, methyl, amino, hydrocarbyl and aryl.

Figure 7:
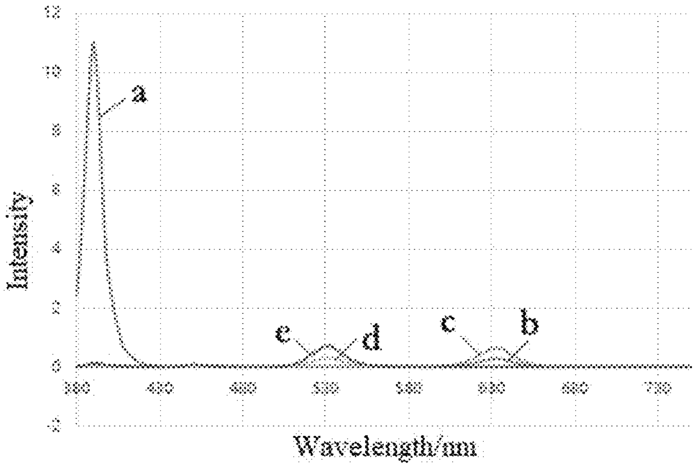
FIG. 7 is a spectrum of a matrix material and quantum dots.

FIG. 7 is a graph showing the emission spectrum of different quantum dots and matrix materials, in which curve a is a graph showing the emission spectrum of the light-emitting element, curve b is a graph showing the emission spectrum of a red light quantum dot excited by the light emitted from the light-emitting element, curve c is a graph showing the emission spectrum of the red light quantum dot and matrix material excited by light emitted from the light-emitting element, curve d is a graph showing the emission spectrum of a green light quantum dot excited by light emitted from the light-emitting element, and curve e is a graph showing the emission spectrum of the green light quantum dot and matrix material excited by light emitted from the light-emitting element. The light emitted by the light-emitting element may be ultraviolet light, the matrix material may emit blue light when being excited by the light emitted by the light-emitting element, and the light emitted by the light-emitting element may excite the quantum dots and the matrix material to emit light. As can be seen from curves c and e in FIG. 7, by exciting the quantum dot with both the light emitted from the light-emitting element and the light emitted from the matrix material, the luminous intensity can increase, the luminous efficiency of the quantum dot can be improved, the display brightness can be improved, and the power consumption can be reduced.

In some embodiments, as shown in FIG. 1, the color conversion substrate further includes scattering particles 24 dispersed in the matrix material 201, and the scattering particles can enable the light emitted by the light-emitting element to be more fully irradiated on the quantum dots and the matrix material, which may be favorable for the optical conversion rate of the quantum dots. By using the matrix material, the content of the scattering particles can be reduced.

In some other embodiments, as shown in FIG. 1, the display panel further includes a scattering particle layer 10 disposed between the color conversion substrate CS and the light-emitting elements LD. The light emitted from the light-emitting element can be more fully irradiated on the quantum dots and the matrix material with the aid of the scattering particle layer 10, which is favorable for improving the optical conversion rate of the quantum dots. The scattering particles include metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$), etc. Examples of the material of organic particles may include acrylic resin, urethane resin, and the like. Regardless of the direction of incidence of the incident light, the scattering particles may scatter light in random directions without substantially converting the wavelength of the light passing through the color conversion pattern.

In embodiments of the present disclosure, the matrix material may include at least one of: pyridine polymer, carbazole polymer, fluorene oligomer, polythiophene polymer, or polyphenylene vinylene polymer. The matrix material may further include a base resin material having high light transmittance, and the base resin material may include at least one of epoxy resin, acrylic resin, cardo resin, and imide resin. For example, the matrix material may include a pyridine polymer and a polyphenylene vinylene polymer, and the base resin material may include epoxy resin.

The matrix material may include at least one of structures in Formulae (2)-(10):

Formula (2)

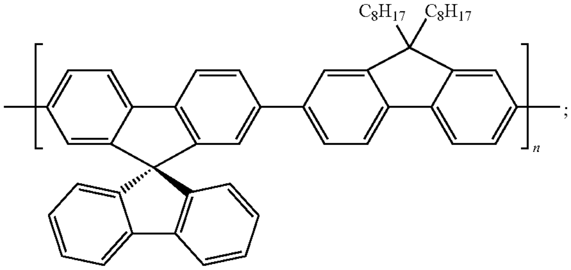

;

Formula (3)

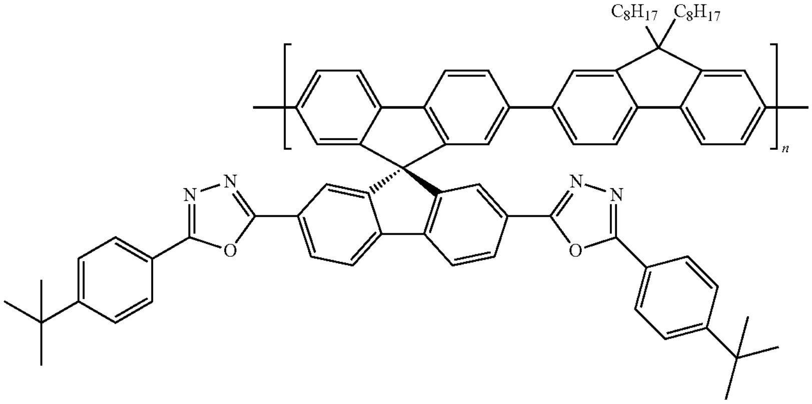

;

-continued
Formula (4)
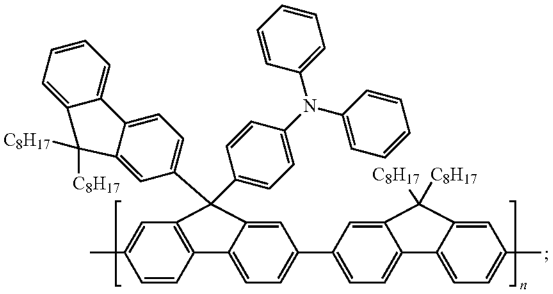
Formula (5)
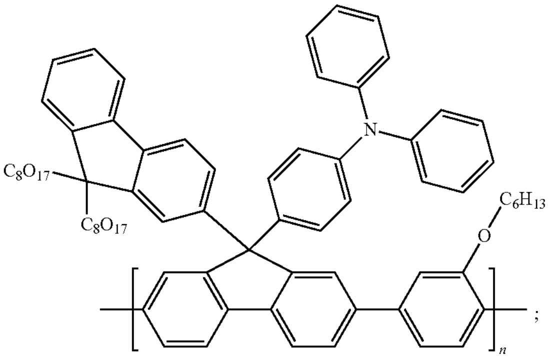
Formula (6)
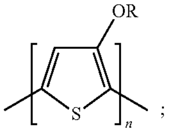
where R in Formula (6) may include one or more of hydrogen, methyl, amino, hydrocarbyl and aryl.
Formula (7)
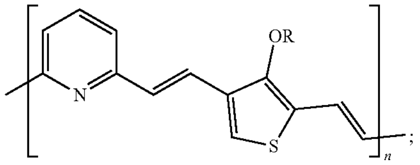
where R in Formula (7) may include one or more of hydrogen, methyl, amino, hydrocarbyl and aryl.
Formula (8)
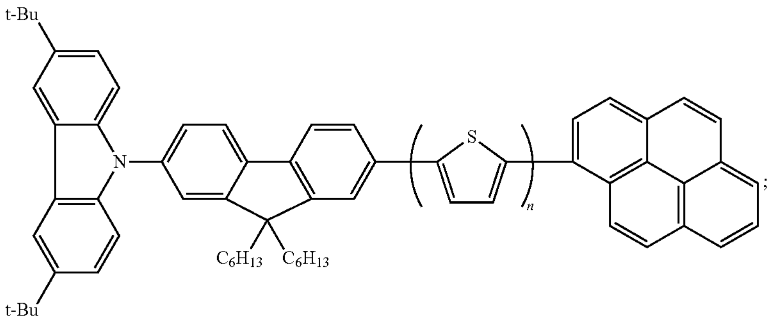

-continued

Formula (9)

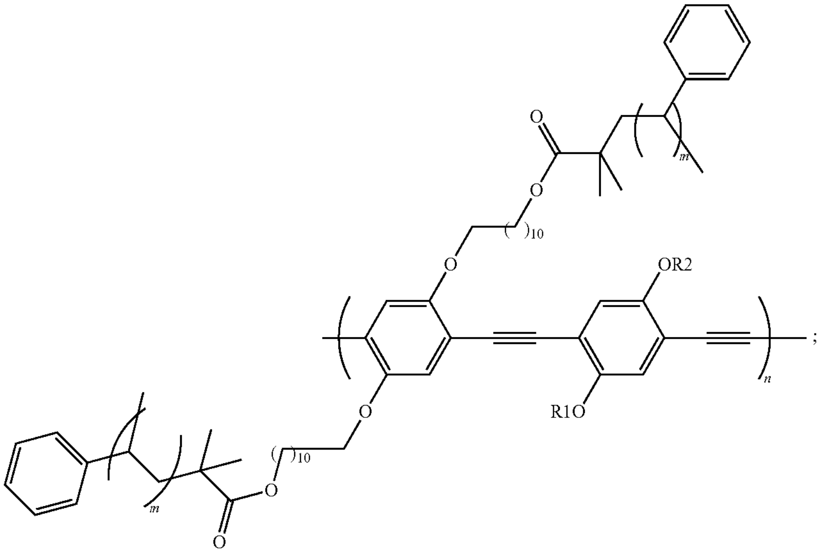

where R1 in Formula (9) may include one or more of hydrogen, methyl, amino, hydrocarbyl and aryl, and R2 in Formula (9) may include one or more of hydrogen, methyl, amino, hydrocarbyl, and aryl.

Formula (10)

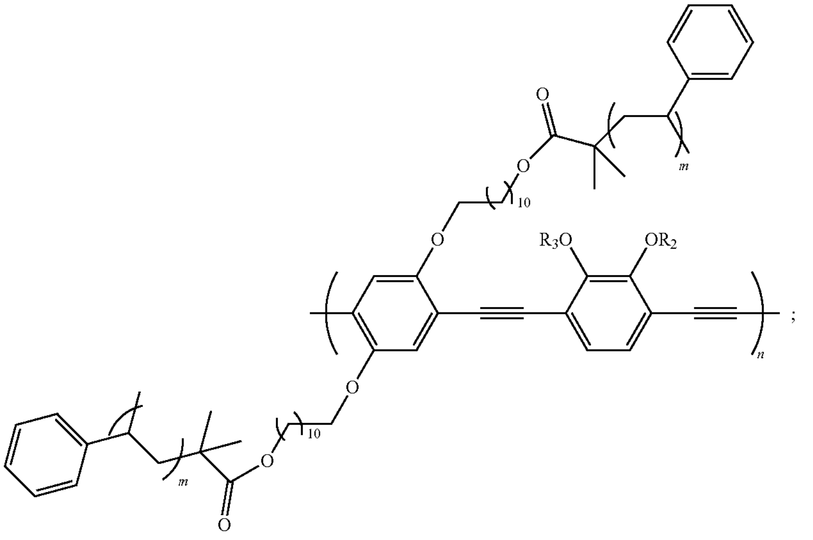

where R1 in Formula (10) may include one or more of hydrogen, methyl, amino, hydrocarbyl and aryl, and R2 in Formula (10) may include one or more of hydrogen, methyl, amino, hydrocarbyl, and aryl.

In some embodiments, as shown in FIG. 1, the display panel may further include: a first barrier layer 30, and the first barrier layer 30 has a first groove 31, the color conversion pattern is arranged in the first groove 31. With the first groove 31, light emission of a pixel can be limited in the area of the first groove 31, and optical crosstalk between adjacent color conversion patterns can be prevented. The thickness of the first barrier layer 30 may be greater than or equal to 6 um (micrometer), the color conversion pattern and the scattering particle layer 10 may share the first barrier layer 30, an area in the first barrier layer 30 corresponding to the color conversion pattern may be provided with the scattering particle layer 10, the scattering particle layer 10 may be arranged between the color conversion pattern and the light-emitting element, and the scattering particle layer 10 may be located in the first groove 31, thereby preventing optical crosstalk. Color filters may include a first color filter CF1, a second color filter CF2 and a third color filter CF3. The first color filter CF1, the second color filter CF2 and the third color filter CF3 may be arranged in corresponding first grooves 31, the color filters may be arranged at a side of the color conversion patterns away from the light-emitting element LD, a light of a corresponding wavelength may be exited through the color filter, and lights of other wavelengths may be absorbed or blocked.

In some embodiments, as shown in FIG. 1, the display panel further includes: a second barrier layer 40, a scattering particle layer 10 and a pixel defining layer PDL, the thickness of the second barrier layer 40 may be less than or equal to 2 um, the second barrier layer 40 has a plurality of second grooves 41, and the scattering particle layer 10 is arranged in the second groove 41. The scattering particle layer 10 may be disposed between the color conversion pattern and the light-emitting element LD to prevent optical crosstalk. An area of the scattering particle layer 10 is smaller than an area of the color conversion pattern, and the pixel defining layer PDL includes a plurality of apertures, each of the light-emitting elements LD is located in one of the openings, and an area of the opening is larger than the area of the scattering particle layer 10, so that by arranging such scattering particle layer 10, an uniform incidence into the color conversion pattern can be realized, and the optical crosstalk can be prevented. A cover layer CAP2 may be formed on the thin film encapsulation layer TFE, the cover layer CAP2 may be located between the thin film encapsulation layer TFE and the second barrier layer 40, and the cover layer CAP2 may function as a protection for the thin film encapsulation layer TFE.

The spacing width between adjacent first grooves 31 in the first barrier layer 30 may be d1, the spacing width between two adjacent second grooves 41 in the second barrier layer 40 may be d2, the spacing width between adjacent openings in the pixel defining layer PDL may be d3, patterns of three film layers including the first barrier layer 30, the second barrier layer 40 and the pixel defining layer PDL may be substantially the same as a whole, with center positions of these patterns coincide with each other. The specific width relationship may be: d2 is greater than d1 and d3, and the larger the different d2-d1 is, the more amount of large-angle backlight can be blocked, the light incident on adjacent quantum dots can be reduced, and the color crosstalk can be reduced. The first barrier layer 30 may be a reflection type barrier layer, and a side of the first barrier layer 30 facing the light-emitting element LD may be a reflective surface, which may improve light utilization rate. The second barrier layer 30 may be an absorption type barrier layer or a reflection type barrier layer, and when the second barrier layer 40 is a barrier layer with the same thickness or design, the light conversion efficiency of the quantum dot when the second barrier layer 40 is the reflection type barrier layer may be about 1.5 times of the light conversion efficiency of the quantum dot when the second barrier layer 40 is the absorption type barrier layer.

In the preparation process, a cell-assembly manner or an ON-EL manner may be adopted. In the cell-assembly manner, a light-emitting base substrate LS having light-emitting elements and a color conversion substrate CS may be prepared separately, wherein after preparing the color filter and the color conversion pattern of the color conversion substrate CS, the color conversion substrate CS is cell-aligned with the light-emitting base substrate LS, and the light-emitting base substrate LS is arranged to be opposite to the color conversion substrate CS through a filling layer FL, which may be specifically shown in FIGS. 3 and 4. In the ON-EL manner, the light-emitting base substrate LS having light-emitting elements can be prepared first, and after the encapsulation is done by using an encapsulation layer, a color conversion substrate CS and a color filter can be directly prepared thereon.

The preparation process of the cell-assembly manner may include following procedures. First, preparing the first barrier layer 30, wherein the height of the first barrier layer 30 is greater than or equal to 6 um. The color conversion substrate CS may be prepared by using a photolithography or printing method, the quantum dots and matrix material may be added, light emitted by the light-emitting element may excite the matrix material to emit blue light. The color conversion pattern having red light quantum dots and the matrix material, and the color conversion pattern having green light quantum dots and the matrix material may be prepared respectively. The second barrier layer 40 is prepared, wherein the film layer height of the second barrier layer 40 can be less than or equal to 2 um. The scattering particle layer is prepared in the second barrier layer 40 corresponding to the pixel. The width of the scattering particle layer is smaller than that of the first groove 31, and the area of the scattering particle layer may be smaller than that of the first groove 31. The pixel defining layer PDL includes a plurality of openings which are arranged corresponding to the color conversion patterns, and each of the light-emitting elements LD is located in one of the openings so as to define an area where the light emitted by the light-emitting element LD is projected. The width of the opening is greater than the width of the scattering particle layer 10, and the area of the opening may be larger than the area of the scattering particle layer 10, so that light passing through the scattering particle layer 10 can be uniformly incident into the color conversion pattern, and optical crosstalk can be prevented. The spacing width between adjacent first grooves 31 in the first barrier layer 30 may be d1, the spacing width between two adjacent second grooves in the second barrier layer 40 may be d2, the spacing width between adjacent openings on the pixel defining layer PDL may be d3, Patterns of three film layers including the first barrier layer 30, the second barrier layer 40 and the pixel defining layer PDL may be substantially the same in general, with centre positions of the various patterns coincide with each other. The specific width relationship may be: d2 is greater than d1 and d3, and the larger a difference d2-d1 is, the more amount of large-angle backlights can be blocked. The amount of light incident on adjacent quantum dots can be reduced, and the color crosstalk can be reduced.

As shown in FIGS. 3 and 4, the color conversion substrate CS may be arranged opposite to the light-emitting base substrate LS. The color conversion substrate CS may include a color conversion pattern for converting the color of incident light. The color conversion pattern may include at least one of a color filter and a wavelength conversion pattern. A sealing layer SL may be located between the light-emitting base substrate LS and the color conversion substrate CS and in the non-display area NDA. The sealing layer SL may be provided along edges of the light-emitting base substrate LS and the color conversion substrate CS in the non-display area NDA to enclose or surround the periphery of the display area DA in plan view. The sealing layer SL may be made of an organic material, such as epoxy resin, and the present disclosure is not limited thereto. The filling layer FL may be located and used for filling a space which is between the light-emitting base substrate LS and the color conversion substrate CS and is surrounded by the sealing layer SL. The filling layer FL may be made of a material capable of transmitting light. The filling layer FL may be made of an organic material such as, but not limited to, a silicon-based organic material or an epoxy-based organic material. In some embodiments, the filling layer FL may be omitted.

Figure 5:
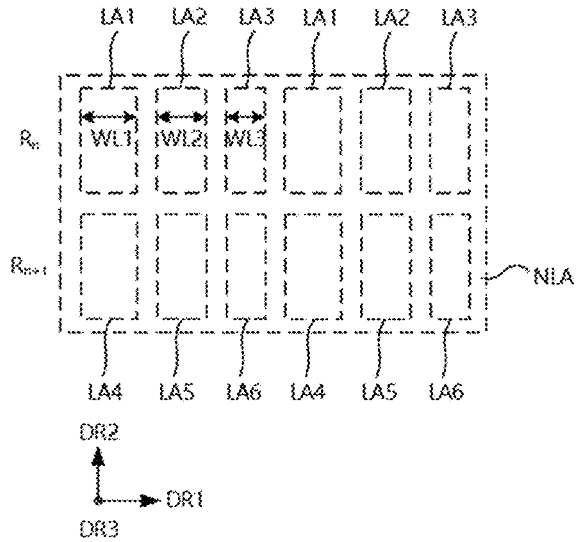
FIG. 5 is a schematic diagram showing an arrangement of different light-emitting areas on a display substrate.

As shown in FIG. 5, the display substrate may include light-emitting areas LA1, LA2, and LA3 disposed in the n-th row RLn in the display area DA, and light-emitting areas LA4, LA5, and LA6 disposed in the (n+1)-th row RL n+1, and the display substrate may include a non-light-emitting area NLA. In the display substrate, the first light-emitting area LA1, the second light-emitting area LA2 and the third light-emitting area LA3 may be arranged in the n-th row RLn along a first direction DR1. The first light-emitting area LA1, the second light-emitting area LA2, and the third light-emitting area LA3 may be sequentially and repeatedly arranged along the first direction DR1. In the (n+1)-th row RL n+1 adjacent to the n-th row RLn in the second direction DR2, the fourth light-emitting area LA4, the fifth light-emitting area LA5, and the sixth light-emitting area LA6 may be sequentially and repeatedly arranged along the first direction DR1.

The first width WL1 of the first light-emitting area LA1, the second width WL2 of the second light-emitting area LA2, and the third width WL3 of the third light-emitting area LA3 are measured in the first direction DR1, and the first width WL1 may be larger than the second width WL2 and the third width WL3. The lengths of the first light-emitting area LA1, the second light-emitting area LA2 and the third light-emitting area LA3 may be the same in the second direction DR2. The second width WL2 and the third width WL3 may be different from each other. For example, the second width WL2 may be greater than the third width WL3. The area of the first light-emitting area LA1 may be larger than the area of the second light-emitting area LA2 and the area of the third light-emitting area LA3, and the area of the second light-emitting area LA2 may be larger than the area of the third light-emitting area LA3. The first width WL1, the second width WL2, and the third width WL3 may be substantially the same. The area of the first light-emitting area LA1, the area of the second light-emitting area LA2 and the area of the third light-emitting area LA3 may be substantially the same.

The fourth light-emitting area LA4 may be located in the (n+1)-th row RL n+1, and the fourth light-emitting area LA4 adjacent to the first light-emitting area LA1 in the second direction DR2 may be the same as the first light-emitting area LA1. The width and area of the fourth light-emitting area LA4 and the structure of components disposed therein may be substantially the same as the width and area of the first light-emitting area LA1 and the structure of components disposed therein. Similarly, the second light-emitting area LA2 and the fifth light-emitting area LA5 adjacent to each other in the second direction DR2 may have substantially the same structure, and the third light-emitting area LA3 and the sixth light-emitting area LA6 adjacent to each other in the second direction DR2 may have substantially the same structure.

Optionally, the display panel further includes a color filter, located at a side of the color conversion pattern away from the light-emitting base substrate. In the embodiment of the present disclosure, the side of the first color conversion pattern 21 away from the light-emitting element LD may be provided with a first color filter CF1 for allowing the light of the first wavelength to pass therethrough, the side of the second color conversion pattern 22 away from the light-emitting element LD may be provided with a second color filter CF2 for allowing the light of the second wavelength to pass therethrough, and the side of the third color conversion pattern 23 away from the light-emitting element LD may be provided with a third color filter CF3 for allowing the light of the third wavelength to pass therethrough. For example, the light of the first wavelength may be red light, the light of the second wavelength may be green light, the light of the third wavelength may be blue light. With the color filter, the light of corresponding wavelength may be exited from a color filter, and light of other wavelengths is absorbed. The red light, green light and blue light emitted by the color filters may be mixed into white light, and thus displaying can be realized. By using the light emitted by the light-emitting element and the light emitted by the matrix material to excite the quantum dot, the brightness of the display panel can be improved and the power consumption for displaying can be reduced.

Optionally, the side of the color conversion pattern away from the light-emitting element LD is provided with a color filter. With the color filter, the light of desired wavelength can be allowed to exit. The color filter may include a first color filter CF1, a second color filter CF2 and a third color filter CF3, wherein the first color filter CF1 may be arranged at a side of the first color conversion pattern 21 away from the light-emitting element LD, the second color filter CF2 may be arranged at a side of the second color conversion pattern 22 away from the light-emitting element LD, and the third color filter CF3 may be arranged at a side of the third color conversion pattern 23 away from the light-emitting element LD. The light of corresponding wavelength can be emitted from the color conversion pattern through the color filter, and the red light, green light and blue light emitted from the color filters may be mixed into white light.

In some embodiments, as shown in FIG. 1, the color conversion substrate CS (color filter substrate) may include a second base substrate SUB2. The second base substrate SUB2 may be made of a light-transmitting material, such as inorganic glass, organic glass, plastic substrate or other organic material substrate. The second base substrate SUB2 may be rigid or flexible. A buffer layer or an insulating layer may also be provided on the second base substrate SUB2 to provide a substrate surface with better performance.

The color conversion substrate CS may include a light shielding pattern BM on one side of the second base substrate SUB2. The light shielding pattern BM may include a plurality of openings for defining a first light-transmitting area TA1, a second light-transmitting area TA2 and a third light-transmitting area TA3 and a light blocking area BA. The cover layer CAP1 may be provided on one side of the first barrier layer 30 adjacent to the light shielding pattern BM, the cover layer CAP1 may be located between the light shielding pattern BM and the first barrier layer 30, and the color conversion pattern may be protected by the cover layer CAP1. The material of the pixel defining layer PDL may be at least one of an organic insulating material such as acrylic resin, epoxy resin, phenolic resin, polyamide resin, polyimide resin, unsaturated polyester resin, polyphenylene resin, polyphenylene sulfide resin, and benzocyclobutene (BCB). The light shielding pattern BM may include organic light blocking material, which is formed through a coating and exposure process. The light shielding pattern BM can prevent light interference between adjacent light-transmitting areas which may cause color mixture, thereby improving the color reproducibility.

The color conversion substrate CS may include color filters CF which are located on one side of the second base substrate SUB2 and within a plurality of openings of the light shielding pattern BM. The color filters CF may include a first color filter CF1 located at the first light-transmitting area TA1, a second color filter CF2 located at the second light-transmitting area TA2, and a third color filter CF3 located at the third light-transmitting area TA3. The first color filter CF1 may selectively transmit light of a first color (e.g., red light) and may block or absorb light of a second color (e.g., green light) and light of a third color (e.g., blue light). The first color filter CF1 may be a red color filter and may include a red colorant such as a red dye or a red pigment. The second color filter CF2 may selectively transmit light of the second color (e.g., green light) and may block or absorb light of the first color (e.g., red light) and light of the third color (e.g., blue light). The third color filter CF3 may selectively transmit light of the third color (e.g., blue light) and may block or absorb light of the second color (e.g., green light) and light of the first color (e.g., red light). The third color filter CF3 may be a blue color filter, and may include a blue colorant such as a blue dye and a blue pigment. The second color filter CF2 may be a green color filter and may include a green colorant such as a green dye and green pigment. The third color filter CF3 may selectively transmit light of the third color (e.g., blue light) and may block or absorb light of the second color (e.g., green light) and light of the first color (e.g., red light). The third color filter CF3 may be a blue color filter, and may include a blue colorant such as a blue dye and a blue pigment. As used herein, the term "colorant" will be understood to include both the dye and pigment. In some embodiments, the first color filter CF1, the second color filter CF2, and the third color filter CF3 may be spaced apart from each other. In some embodiments, the first color filters CF1 of the same color, which are respectively located in the first and fourth light-transmitting area TA1 and TA4 in adjacent rows Rn and Rn+1 along the second direction DR2, may have a continuous film layer.

In an embodiment of the present disclosure, A display apparatus includes the display panel as described in the above embodiments, a driving circuit, and a power supply circuit. The display panel may be driven by the driving circuit for displaying, and the display panel may be powered by the power supply circuit. The display apparatus having the display panel as described in the above embodiments has advantages such as high luminous efficiency, high luminance of the display panel, and low power consumption.

While the foregoing is directed to the detailed embodiments of the present disclosure, it should be noted that various modifications and adaptations may be made by those skilled in the art without departing from the principle of the disclosure, and such modifications and adaptations fall within the scope of the disclosure.

What is claimed is:

1. A display panel, comprising:
- a light-emitting base substrate, the light-emitting base substrate comprising a plurality of light-emitting elements, and is configured to emit a first light; and
- a color conversion substrate, the color conversion substrate comprising a plurality of color conversion patterns, the color conversion pattern comprising a matrix material and quantum dots dispersed in the matrix material,
- wherein the matrix material is configured to excite a second light under irradiation of the first light, and the quantum dots are configured to emit light under irradiation of the first light and the second light,
- wherein the display panel further comprises:
  - a first barrier layer, the first barrier layer having a plurality of first grooves, the plurality of color conversion patterns being disposed in the plurality of first grooves;
  - a second barrier layer, having a plurality of second grooves;
  - a scattering particle layer, disposed in the second groove, wherein an area of the scattering particle layer is smaller than an area of the color conversion pattern; and
  - a pixel defining layer, comprising a plurality of openings, wherein each of the plurality of light-emitting elements is disposed in one of the plurality of openings, and an area of the opening is larger than the area of the scattering particle layer, and
- wherein the first barrier layer and the plurality of color conversion patterns are provided on a side of the second barrier layer and the scattering particle layer away from the light-emitting base substrate.

2. The display panel according to claim 1, wherein the color conversion patterns include a first color conversion pattern and a second color conversion pattern;
- the first color conversion pattern comprises a first matrix material and first quantum dots dispersed in the first matrix material, the first matrix material is configured to excite the second light under irradiation of the first light, and the first quantum dots are configured to emit a light of a first wavelength under irradiation of the first light and the second light;
- the second color conversion pattern comprises a second matrix material and second quantum dots dispersed in the second matrix material, the second matrix material is configured to excite the second light under irradiation of the first light, and the second quantum dots are configured to emit a light of a second wavelength under irradiation of the first light and the second light, wherein the first wavelength is different from the second wavelength.

3. The display panel according to claim 2, wherein the color conversion patterns include a third color conversion pattern, the third color conversion pattern comprising a third matrix material, and the third matrix material is configured to excite a light of a third wavelength under irradiation of the first light, wherein the first wavelength and the second wavelength are different from the third wavelength.

4. The display panel according to claim 3, wherein the color conversion substrate further comprises scattering particles dispersed in the matrix material.

5. The display panel according to claim 3, wherein each of the first matrix material, the second matrix material and the third matrix material comprises at least one of:
- pyridine polymer, carbazole polymer, fluorene oligomer, polythiophene polymer, or polyphenylene vinylene polymer.

6. The display panel according to claim 2, wherein the color conversion substrate further comprises scattering particles dispersed in the matrix material.

7. The display panel according to claim 2, wherein each of the first matrix material and the second matrix material comprises at least one of:
- pyridine polymer, carbazole polymer, fluorene oligomer, polythiophene polymer, or polyphenylene vinylene polymer.

8. The display panel according to claim 1, wherein the first light has a first light wavelength, and the first light wavelength is less than or equal to 450 nm.

9. The display panel according to claim 1, wherein the second light has a second light wavelength, the second light wavelength is greater than 450 nm, and is less than or equal to 460 nm.

10. The display panel according to claim 1, wherein a difference between a peak wavelength of the first light and a peak wavelength of the second light is greater than or equal to 10 nm.

11. The display panel according to claim 1, wherein the color conversion substrate further comprises scattering particles dispersed in the matrix material.

12. The display panel according to claim 1, wherein the matrix material comprises at least one of:

pyridine polymer, carbazole polymer, fluorene oligomer, polythiophene polymer, or polyphenylene vinylene polymer.

13. The display panel according to claim 1, further comprising a color filter, located at a side of the color conversion pattern away from the light-emitting base substrate.

14. A display panel, comprising:

a light-emitting base substrate, the light-emitting base substrate comprising a plurality of light-emitting elements, and is configured to emit a first light; and a color conversion substrate, the color conversion substrate comprising a plurality of color conversion patterns, the color conversion pattern comprising a matrix material and quantum dots dispersed in the matrix material, wherein the matrix material is configured to excite a second light under irradiation of the first light, and the quantum dots are configured to emit light under irradiation of the first light and the second light, wherein the first light has a first light wavelength, and the first light wavelength is less than or equal to 450 nm, wherein the second light has a second light wavelength, the second light wavelength is greater than 450 nm, and is less than or equal to 460 nm, and wherein the display panel further comprises:

a first barrier layer, the first barrier layer having a plurality of first grooves, the plurality of color conversion patterns being disposed in the plurality of first grooves;

a second barrier layer, having a plurality of second grooves;

a scattering particle layer, disposed in the second groove, wherein an area of the scattering particle layer is smaller than an area of the color conversion pattern; and a pixel defining layer, comprising a plurality of openings, wherein each of the plurality of light-emitting elements is disposed in one of the plurality of openings, and an area of the opening is larger than the area of the scattering particle layer.

15. The display panel according to claim 14, wherein a difference between a peak wavelength of the first light and a peak wavelength of the second light is greater than or equal to 10 nm.

16. The display panel according to claim 14, wherein the color conversion patterns include a first color conversion pattern and a second color conversion pattern, the first color conversion pattern comprises a first matrix material and first quantum dots dispersed in the first matrix material, the first matrix material is configured to excite the second light under irradiation of the first light, and the first quantum dots are configured to emit a light of a first wavelength under irradiation of the first light and the second light, the second color conversion pattern comprises a second matrix material and second quantum dots dispersed in the second matrix material, the second matrix material is configured to excite the second light under irradiation of the first light, and the second quantum dots are configured to emit a light of a second wavelength under irradiation of the first light and the second light, wherein the first wavelength is different from the second wavelength, and the color conversion patterns include a third color conversion pattern, the third color conversion pattern comprising a third matrix material, and the third matrix material is configured to excite a light of a third wavelength under irradiation of the first light, wherein the first wavelength and the second wavelength are different from the third wavelength.

17. A display panel, comprising:

a light-emitting base substrate, the light-emitting base substrate comprising a plurality of light-emitting elements, and is configured to emit a first light; and a color conversion substrate, the color conversion substrate comprising a plurality of color conversion patterns, the color conversion pattern comprising a matrix material and quantum dots dispersed in the matrix material, wherein the matrix material is configured to excite a second light under irradiation of the first light, and the quantum dots are configured to emit light under irradiation of the first light and the second light, wherein a difference between a peak wavelength of the first light and a peak wavelength of the second light is greater than or equal to 10 nm, and wherein the display panel further comprises:

a first barrier layer, the first barrier layer having a plurality of first grooves, the plurality of color conversion patterns being disposed in the plurality of first grooves;

a second barrier layer, having a plurality of second grooves;

a scattering particle layer, disposed in the second groove, wherein an area of the scattering particle layer is smaller than an area of the color conversion pattern; and a pixel defining layer, comprising a plurality of openings, wherein each of the plurality of light-emitting elements is disposed in one of the plurality of openings, and an area of the opening is larger than the area of the scattering particle layer.

18. The display panel according to claim 17, wherein the color conversion patterns include a first color conversion pattern and a second color conversion pattern, the first color conversion pattern comprises a first matrix material and first quantum dots dispersed in the first matrix material, the first matrix material is configured to excite the second light under irradiation of the first light, and the first quantum dots are configured to emit a light of a first wavelength under irradiation of the first light and the second light, the second color conversion pattern comprises a second matrix material and second quantum dots dispersed in the second matrix material, the second matrix material is configured to excite the second light under irradiation of the first light, and the second quantum dots are configured to emit a light of a second wavelength under irradiation of the first light and the second light, wherein the first wavelength is different from the second wavelength, and the color conversion patterns include a third color conversion pattern, the third color conversion pattern comprising a third matrix material, and the third matrix material is configured to excite a light of a third wavelength under irradiation of the first light, wherein the first wavelength and the second wavelength are different from the third wavelength.

19. The display panel according to claim 17, wherein the color conversion substrate further comprises scattering particles dispersed in the matrix material.

20. The display panel according to claim 17, wherein the matrix material comprises at least one of:

pyridine polymer, carbazole polymer, fluorene oligomer, polythiophene polymer, or polyphenylene vinylene polymer.

* * * * *